US009123654B2

United States Patent
Leobandung

(10) Patent No.: US 9,123,654 B2
(45) Date of Patent: Sep. 1, 2015

(54) TRILAYER SIT PROCESS WITH TRANSFER LAYER FOR FINFET PATTERNING

(71) Applicant: International Business Machines Corporation, Armonk, NY (US)

(72) Inventor: Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 13/767,932

(22) Filed: Feb. 15, 2013

(65) Prior Publication Data

US 2014/0231913 A1    Aug. 21, 2014

(51) Int. Cl.
| | | |
|---|---|---|
| H01L 21/308 | (2006.01) | |
| H01L 29/66 | (2006.01) | |
| H01L 29/78 | (2006.01) | |
| H01L 29/786 | (2006.01) | |

(52) U.S. Cl.
CPC ...... *H01L 21/3086* (2013.01); *H01L 29/66795* (2013.01); *H01L 29/78648* (2013.01)

(58) Field of Classification Search
CPC ............ H01L 21/0337; H01L 21/0338; H01L 21/3086; H01L 21/3088; H01L 21/32139; H01L 21/845; H01L 27/0924; H01L 27/1211; H01L 29/41791; H01L 29/66795; H01L 21/823431; H01L 21/823821; H01L 21/76264; H01L 27/0886; H01L 21/308; H01L 21/3081; H01L 21/7624; H01L 27/1203; H01L 21/84; H01L 29/785
USPC ................................... 257/347; 438/479, 694
See application file for complete search history.

(56) References Cited

U.S. PATENT DOCUMENTS

| | | | |
|---|---|---|---|
| 4,568,410 A * | 2/1986 | Thornquist | ................... 438/724 |
| 4,944,836 A * | 7/1990 | Beyer et al. | .................... 438/633 |
| 6,660,596 B2 * | 12/2003 | Adkisson et al. | ............. 438/286 |
| 6,905,941 B2 | 6/2005 | Doris et al. | |
| 7,666,741 B2 | 2/2010 | Li et al. | |
| 7,692,254 B2 * | 4/2010 | Anderson et al. | ............. 257/401 |
| 7,938,081 B2 | 5/2011 | Chen et al. | |
| 8,268,727 B2 | 9/2012 | Johnson et al. | |
| 2003/0067017 A1 * | 4/2003 | Ieong et al. | .................... 257/206 |
| 2004/0222477 A1 * | 11/2004 | Aller et al. | ..................... 257/412 |
| 2006/0003268 A1 * | 1/2006 | Hong et al. | .................... 430/323 |
| 2006/0068596 A1 * | 3/2006 | Dobuzinsky et al. | ......... 438/740 |
| 2006/0084243 A1 * | 4/2006 | Zhang et al. | ................... 438/478 |
| 2007/0004117 A1 * | 1/2007 | Yagishita | ....................... 438/197 |
| 2007/0063276 A1 * | 3/2007 | Beintner et al. | .............. 257/347 |
| 2007/0066009 A1 * | 3/2007 | Furukawa et al. | ............ 438/240 |

(Continued)

*Primary Examiner* — Khiem D Nguyen
*Assistant Examiner* — Pauline Vu
(74) *Attorney, Agent, or Firm* — Louis J. Percello; Michael J. Chang, LLC

(57) ABSTRACT

Improved sidewall image transfer (SIT) techniques are provided. In one aspect, a SIT method includes the following steps. An oxide layer is formed on a substrate. A transfer layer is formed on a side of the oxide layer opposite the substrate. A mandrel layer is formed on a side of the transfer layer opposite the oxide layer. The mandrel layer is patterned to form at least one mandrel. Sidewall spacers are formed on opposite sides of the at least one mandrel. The at least one mandrel is removed, wherein the transfer layer covers and protects the substrate during removal of the at least one mandrel. The transfer layer is etched using the sidewall spacers as a hardmask to form a patterned transfer layer. The oxide layer and the sidewall spacers are removed from the substrate. The substrate is etched using the patterned transfer layer as a hardmask.

14 Claims, 6 Drawing Sheets

(56) References Cited

U.S. PATENT DOCUMENTS

| | | | |
|---|---|---|---|
| 2007/0082437 A1* | 4/2007 | Cheng et al. | 438/197 |
| 2007/0170521 A1* | 7/2007 | Abadeer et al. | 257/401 |
| 2007/0215960 A1* | 9/2007 | Zhu et al. | 257/414 |
| 2007/0218628 A1* | 9/2007 | Orlowski et al. | 438/254 |
| 2008/0124868 A1* | 5/2008 | Nowak | 438/268 |
| 2008/0258207 A1* | 10/2008 | Radosavljevic et al. | 257/327 |
| 2009/0004862 A1* | 1/2009 | Kim et al. | 438/692 |
| 2010/0015778 A1* | 1/2010 | Lin et al. | 438/443 |
| 2010/0224943 A1* | 9/2010 | Kawasaki | 257/390 |
| 2010/0248481 A1* | 9/2010 | Schultz | 438/694 |
| 2011/0049583 A1* | 3/2011 | Lin et al. | 257/288 |
| 2011/0053361 A1* | 3/2011 | Muralidhar et al. | 438/585 |
| 2011/0101455 A1* | 5/2011 | Basker et al. | 257/347 |
| 2011/0111596 A1* | 5/2011 | Kanakasabapathy | 438/694 |
| 2011/0127582 A1 | 6/2011 | Cheng et al. | |
| 2011/0318936 A1* | 12/2011 | Ko et al. | 438/724 |
| 2012/0235247 A1 | 9/2012 | Cai et al. | |
| 2012/0252216 A1 | 10/2012 | Adam et al. | |
| 2013/0001750 A1* | 1/2013 | Arnold et al. | 257/618 |
| 2013/0029494 A1* | 1/2013 | Sasaki et al. | 438/724 |

* cited by examiner

TRILAYER SIT PROCESS WITH TRANSFER LAYER FOR FINFET PATTERNING

FIELD OF THE INVENTION

The present invention relates to sidewall image transfer (SIT) patterning and more particularly, to improved SIT techniques that employ a (e.g., nitride) transfer layer which protects an underlying substrate during mandrel removal without the need for a planarizing layer.

BACKGROUND OF THE INVENTION

Current FIN field-effect transistor (FINFET) process flows often employ sidewall image transfer (SIT) patterning to produce fins at a pitch beyond that achievable using standard lithography. A conventional SIT process generally involves use of a sacrificial mandrel (typically formed from amorphous silicon) to place spacers. Once the mandrel is removed, the spacers can be used as a hardmask to pattern the fins.

Removing the mandrel selective to the underlying substrate can, however, be a challenge. For instance, if the substrate is also formed from silicon, then removal of the mandrel without affecting the substrate is difficult. To solve this problem, a planarizing layer can be deposited onto the substrate, covering the mandrel, and then recessed to expose a top of the mandrel. The planarizing layer will protect the underlying substrate during mandrel removal. However, successful implementation of this scheme in an SIT process flow requires fine tuning of the density of the planarizing material which is oftentimes difficult to control.

Therefore improved SIT pattering processes would be desirable.

SUMMARY OF THE INVENTION

The present invention provides improved sidewall image transfer (SIT) techniques that employ a (e.g., nitride) transfer layer. In one aspect of the invention, a SIT method is provided. The method includes the following steps. An oxide layer is formed on a substrate. A transfer layer is formed on a side of the oxide layer opposite the substrate. A mandrel layer is formed on a side of the transfer layer opposite the oxide layer. The mandrel layer is patterned to form at least one mandrel. Sidewall spacers are formed on opposite sides of the at least one mandrel. The at least one mandrel is removed, wherein the transfer layer covers and protects the substrate during removal of the at least one mandrel. The transfer layer is etched using the sidewall spacers as a hardmask to form a patterned transfer layer. The oxide layer and the sidewall spacers are removed from the substrate. The substrate is etched using the patterned transfer layer as a hardmask to form features in the substrate.

In another aspect of the invention, a method of fabricating a FIN field-effect transistor (FINFET) device is provided. The method includes the following steps. An oxide layer is formed on an SOI substrate having a SOI layer over a BOX. A transfer layer is formed on a side of the oxide layer opposite the substrate. A mandrel layer is formed on a side of the transfer layer opposite the oxide layer. The mandrel layer is patterned to form at least one mandrel. Sidewall spacers are formed on opposite sides of the at least one mandrel. The at least one mandrel is removed, wherein the transfer layer covers and protects the substrate during removal of the at least one mandrel. The transfer layer is etched using the sidewall spacers as a hardmask to form a patterned transfer layer. The oxide layer and the sidewall spacers are removed from the substrate. The SOI layer is etched using the patterned transfer layer as a hardmask to form fins in the SOI layer. The patterned transfer layer is removed without eroding the BOX. A gate electrode is formed over a portion of each of the fins that serve as a channel region of the FINFET device, and wherein portions of the fins that extend out from under the gate electrode serve as source and drain regions of the FINFET device.

In yet another aspect of the invention, a trilayer SIT structure for patterning a substrate is provided. The trilayer SIT structure includes an oxide layer; a nitride transfer layer on the oxide layer; and oxide sidewall spacers on the transfer layer.

In still yet another aspect of the invention, a FINFET device is provided. The FINFET device includes fins etched in an SOI layer of an SOI wafer wherein the SOI layer is present over a BOX, wherein the fins have a pitch of from about 10 nm to about 80 nm, and wherein the BOX beneath the fins is uneroded; and a gate electrode over a portion of each of the fins that serve as a channel region of the FINFET device, and wherein portions of the fins that extend out from under the gate electrode serve as source and drain regions of the FINFET device.

A more complete understanding of the present invention, as well as further features and advantages of the present invention, will be obtained by reference to the following detailed description and drawings.

DETAILED DESCRIPTION OF PREFERRED EMBODIMENTS

As provided above, with conventional sidewall image transfer (SIT) patterning processes, etch selectivity between the mandrel and the underlying substrate can pose problems, oftentimes requiring the use of a planarizing layer the parameters of which are difficult to control. Advantageously, provided herein are SIT techniques which avoid the problems associated with use of a planarizing layer, by employing a SIT transfer layer on the substrate which serves to i) protect the substrate during the mandrel etch, and which is then used to ii) transfer the pattern to the substrate. Accordingly, no tight control of etch selectivity (as with conventional processes) is needed. As will be described in detail below, the SIT transfer layer is part of a unique trilayer SIT patterning structure which includes a thin buffer oxide layer, the SIT transfer layer (e.g., a nitride layer), and (e.g., oxide) sidewall spacers.

Figure 1:
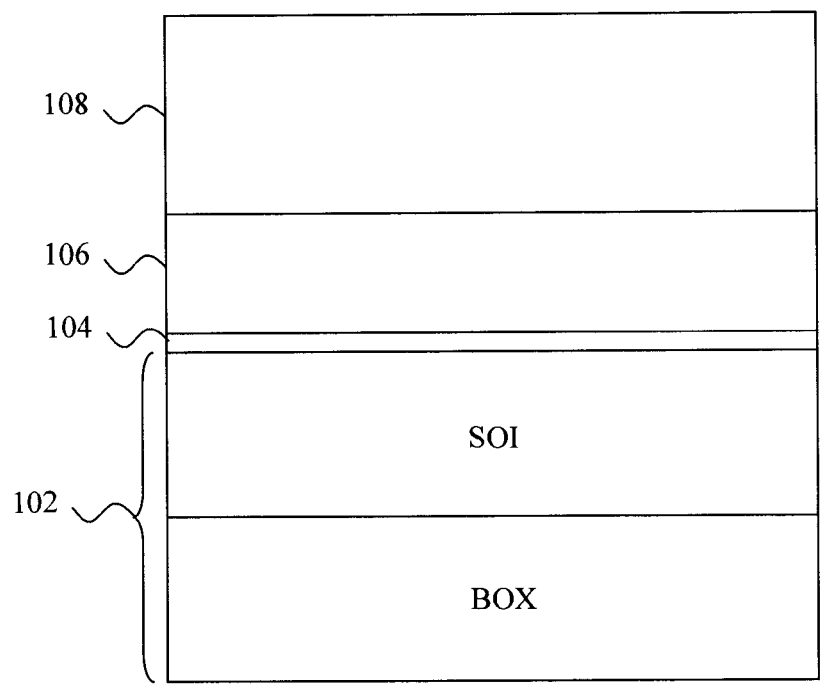
FIG. 1 is a cross-sectional diagram illustrating a starting platform for an exemplary sidewall image transfer (SIT) patterning process flow including a substrate, an oxide layer on the substrate, an SIT transfer layer on the oxide layer, and a mandrel layer on the SIT transfer layer according to an embodiment of the present invention.

The present techniques will now be described in detail by way of reference to FIGS. 1-7 which depict an exemplary SIT patterning process flow employing the present SIT transfer layer. As shown in FIG. 1, the starting platform for the process is a substrate 102. Ultimately, the process will be used to pattern features in the substrate 102. Thus, the particular substrate chosen should be based on the structures, devices, etc. being fabricated. For example, the features patterned in the substrate 102 may be fins used in the fabrication of a FIN field effect transistor (FINFET) device. In that case, the substrate 102 may be a semiconductor-on-insulator (SOI) or a bulk semiconductor wafer. It is notable however that the use of an SOI or bulk semiconductor wafer is merely exemplary and present techniques are broadly applicable to the use of any substrate in which features are to be patterned.

In the example depicted in the figures, a SOI wafer is shown. A SOI wafer includes a SOI layer (e.g., silicon (Si), germanium (Ge), silicon-germanium (SiGe), etc.) separated from a substrate by a buried oxide or BOX. For ease of depiction, the substrate is not shown. Again, the use of a SOI wafer as the substrate is merely exemplary.

A very thin oxide (buffer) layer 104 is then formed (deposited or grown) on the substrate. In the example shown in FIG. 1, the oxide layer 104 is formed on the SOI layer. According to an exemplary embodiment, the oxide layer is formed having a thickness of from about 1 nanometer (nm) to about 5 nm, and ranges therebetween, e.g., from about 1 nm to about 2 nm, and ranges therebetween. As described above, this oxide layer 104 is one part of the present unique trilayer SIT patterning structure.

A transfer layer 106 is then formed on the oxide layer 104. According to an exemplary embodiment, the transfer layer 106 is formed from a nitride material, such as silicon nitride, which is deposited onto the substrate using a method such as chemical vapor deposition (CVD) to a thickness of from about 30 nm to about 50 nm. It may be desirable to planarize the transfer layer 106 using a method such as chemical-mechanical planarization (CMP) to provide a flat surface on which to form the SIT mandrel (see below). As described above, this transfer layer 106 is a second component of the present trilayer SIT patterning structure.

Next, a mandrel layer 108 is formed on the transfer layer 106. According to an exemplary embodiment, the mandrel layer 108 is formed from amorphous silicon which is deposited on the transfer layer 106 using a deposition method such as CVD.

Figure 2:
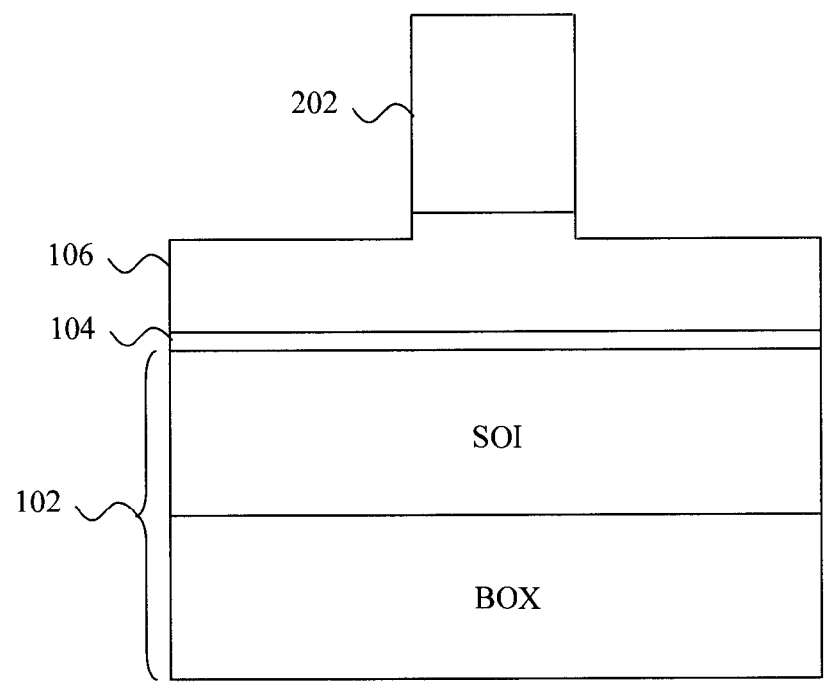
FIG. 2 is a cross-sectional diagram illustrating the mandrel layer having been patterned to form a mandrel according to an embodiment of the present invention.

As shown in FIG. 2, the mandrel layer 108 is next patterned using standard lithography and etching techniques to form a mandrel 202. It is notable that while a single mandrel is shown in the figures, multiple mandrels may be formed in the same manner as described herein. This mandrel patterning step can include forming a hardmask (not shown) on the mandrel layer 108 with the footprint and location of the mandrel(s). A directional etch (such as reactive ion etching (RIE)) can then be performed to define the mandrel(s). Any hardmask remaining after the etch can be removed, for example, using a wet or dry etching process. As shown in FIG. 2, it is not necessary to tightly control the mandrel etch and it is permissible for the patterned mandrel to extend part way into the SIT transfer layer.

Figure 3:
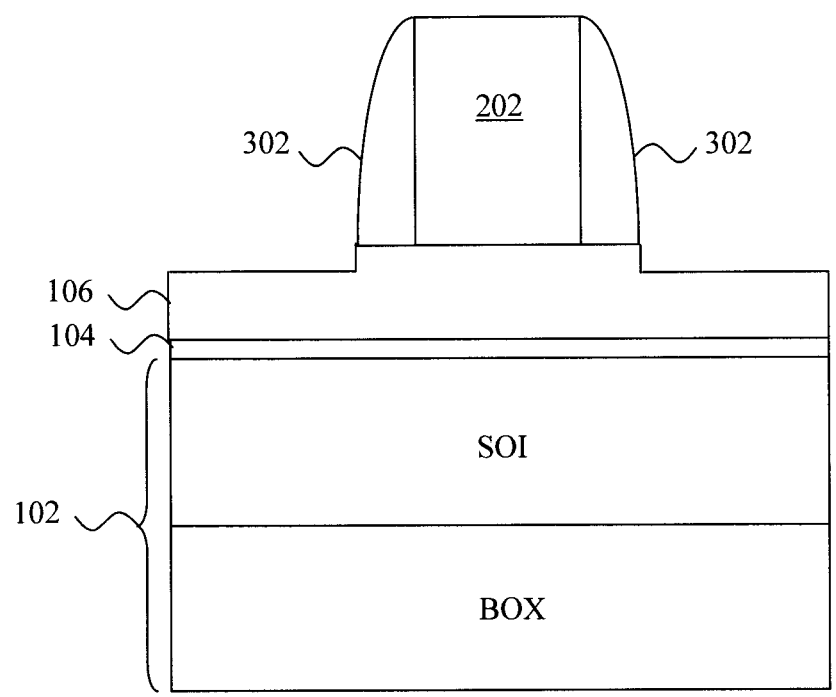
FIG. 3 is a cross-sectional diagram illustrating sidewall spacers having been formed on opposite sides of the mandrel, wherein the sidewall spacers, the SIT transfer layer and the oxide layer form a trilayer SIT patterning structure according to an embodiment of the present invention.

As shown in FIG. 3, sidewall spacers 302 are then formed on opposite sides of the mandrel 202. According to an exemplary embodiment, the sidewall spacers 302 are formed from an oxide material, such as silicon oxide. By way of example only, the sidewall spacers 302 can be formed by first depositing the spacer material onto the substrate (so as to bury the mandrel) and then patterning the material using conventional lithography and etching (e.g., RIE) techniques to form spacers 302. As described above, the sidewall spacers 302 are the third component of the present trilayer SIT patterning structure. Thus, according to an exemplary embodiment, the present trilayer SIT structure includes the thin oxide layer 104, a nitride transfer layer 106, and oxide sidewall spacers 302.

Here again etch selectivity between the sidewall spacer oxide and the (nitride) SIT transfer layer is not critical. For instance an etch selectivity for the sidewall spacer oxide as compared to the SIT transfer layer nitride of less than or equal to about 1:2 is suitable. Even an etch selectivity of 1:1 would suffice as long as the etch is endpointed somewhere within the SIT transfer layer. Thus, as shown in FIG. 3, it is not necessary to tightly control the sidewall spacer etch and it is permissible for the etch to extend part way into the SIT transfer layer (i.e., the etch used to pattern the sidewall spacers may also (permissibly) pattern a portion of the SIT transfer layer).

Figure 4:
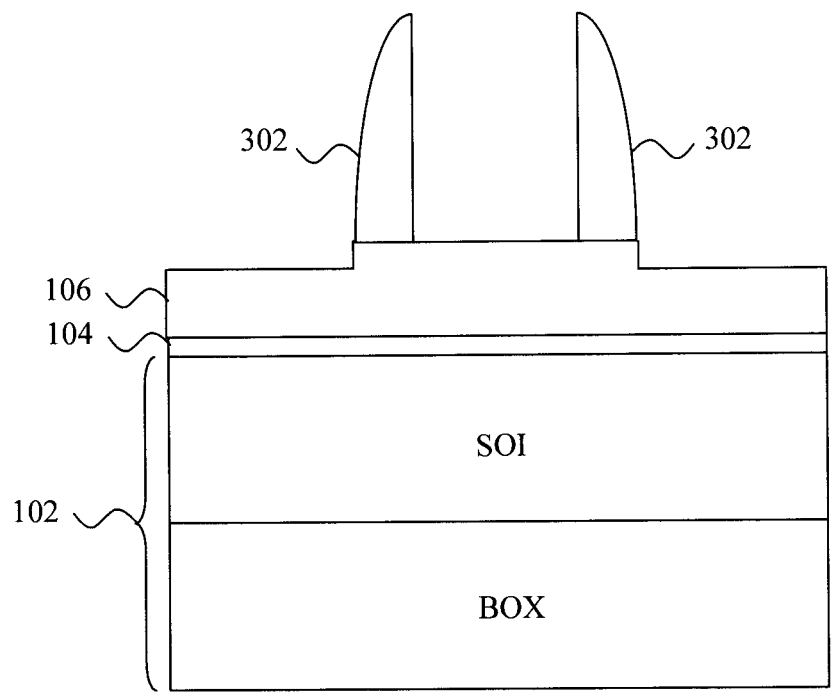
FIG. 4 is a cross-sectional diagram illustrating the mandrel having been removed according to an embodiment of the present invention.

As shown in FIG. 4, the mandrel 202 is then removed. According to an exemplary embodiment, the mandrel 202 is removed using a wet etching process. Advantageously, with the present process the substrate 102 is protected by the transfer layer 106. Thus, the wet etch can be performed to remove the mandrel 202 without concern for etch selectivity between the mandrel 202 and the substrate 102, since the transfer layer 106 is present therebetween.

By comparison, as highlighted above, with conventional SIT process flows a planarizing layer is oftentimes formed over the substrate at this stage of the process so as to protect the substrate during the mandrel removal. Specifically, after deposition, the planarizing layer is typically polished back to expose a top of the mandrel. This permits the mandrel to be selectively removed. However, it is difficult to control the parameters of the planarizing layer. For instance, unless the process is tightly controlled, some portions of the recessed planarizing layer may end up being thinner than others—leaving the underlying substrate insufficiently protected during the mandrel etch.

Advantageously, with the present techniques, the transfer layer 106 is already present, covering and protecting the substrate 102. Therefore, no additional planarizing layer is needed. Further, as highlighted above, the transfer layer acts as an intermediary layer between the mandrel and the substrate, such that the etch selectivity during the mandrel etch (e.g., between the amorphous silicon mandrel and the transfer layer nitride) and/or during the sidewall spacer etch (e.g., between the sidewall spacer oxide and the transfer layer nitride) does not have to be tightly controlled. Accordingly, the complexity of the fabrication process is kept to a minimum.

Figure 5:
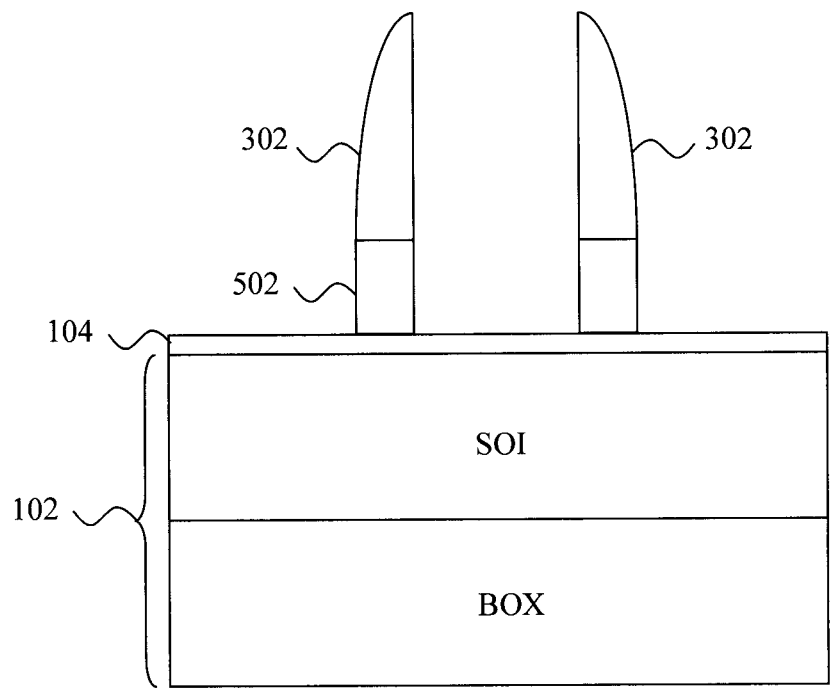
FIG. 5 is a cross-sectional diagram illustrating the sidewall spacers having been used as a hardmask to etch the transfer layer, resulting in a patterned transfer layer according to an embodiment of the present invention.

As shown in FIG. 5, the sidewall spacers are used as a hardmask to etch the transfer layer 106, resulting in patterned SIT transfer layer 502. According to an exemplary embodiment, the transfer layer is etched using a radial line slot antenna (RLSA™) plasma etch which provides good etch selectivity between the oxide sidewall spacers 302/oxide layer 104 and the nitride transfer layer 106. RLSA™ plasma etching is described, for example, in U.S. Pat. No. 7,938,081 issued to Chen et al., entitled "Radial line slot antenna having a conductive layer," the contents of which are incorporated by reference herein.

Figure 6:
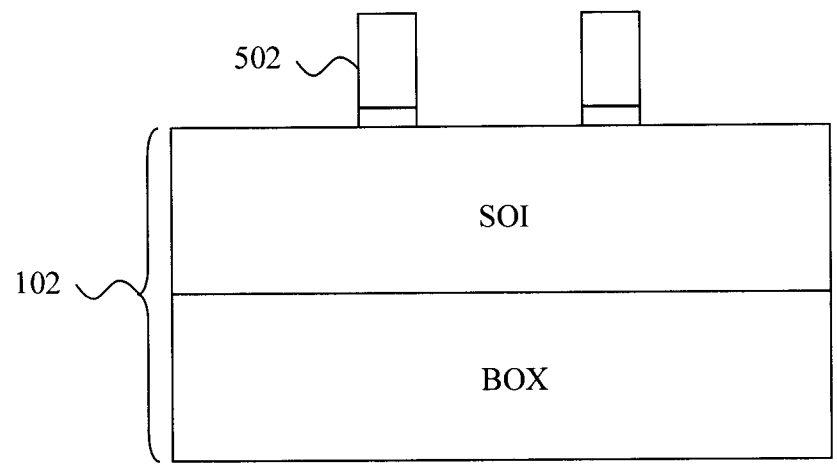
FIG. 6 is a cross-sectional diagram illustrating the oxide sidewall spacers and oxide layer having been stripped from the substrate according to an embodiment of the present invention.

The oxide sidewall spacers 302 and oxide layer 104 are then stripped/removed from the substrate. See FIG. 6. According to an exemplary embodiment, this oxide strip is performed using a chemical oxide removal (COR) process or a Siconi™ preclean. For description of a COR process see, for example, U.S. Pat. No. 6,905,941 issued to Doris et al., entitled "Structure and method to fabricate ultra-thin Si channel devices," the contents of which are incorporated by reference herein. For a description of the Siconi™ preclean see, for example, U.S. Patent Application Publication Number 20120252216 filed by Adam et al., entitled "Low-temperature in-situ removal of oxide from a silicon surface during CMOS epitaxial processing," the contents of which are incorporated by reference herein. As shown in FIG. 6, a portion of the oxide layer 106 present between the patterned SIT transfer layer 502 and the substrate may remain after the oxide strip.

Figure 7:
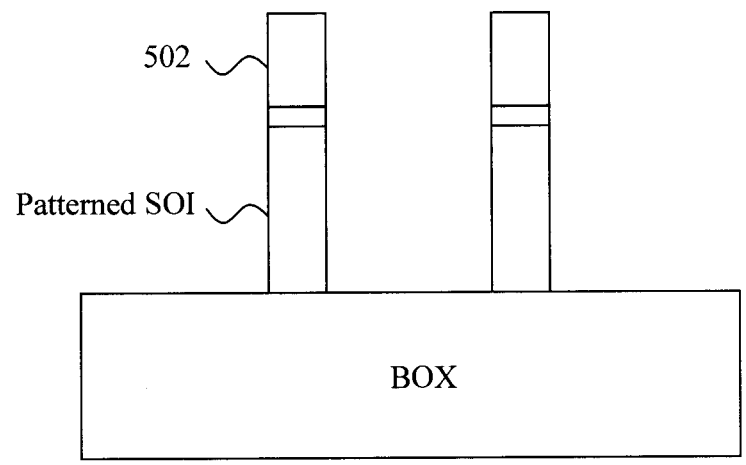
FIG. 7 is a cross-sectional diagram illustrating the patterned transfer layer having been used as a hardmask to etch the substrate, resulting in a patterned substrate according to an embodiment of the present invention.
Figure 7A:
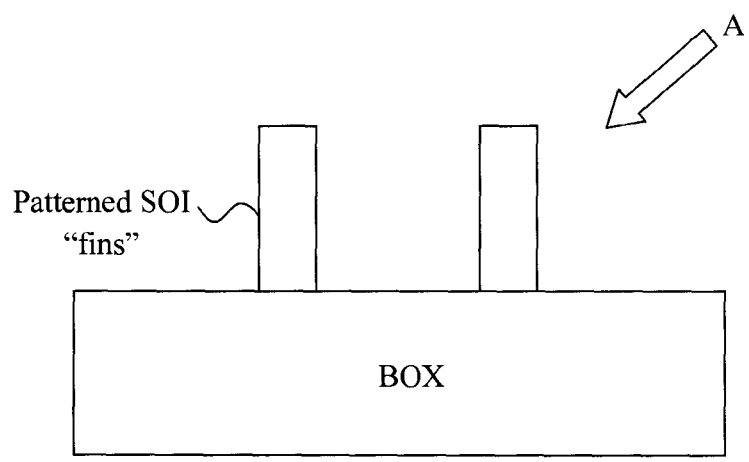
FIG. 7A is a cross-sectional diagram illustrating part of an exemplary process for fabricating a FIN field-effect transistor (FINFET) device based on the structure of FIG. 7 wherein the patterned transfer layer is removed from on top of the features patterned in the substrate (e.g., fins) according to an embodiment of the present invention.

As shown in FIG. 7, the patterned SIT transfer layer 502 is used as a hardmask to etch the substrate, resulting in a patterned substrate. Namely, by way of the present process, the pattern from the sidewall spacers is now transferred to the substrate. Any of the patterned transfer layer 502 remaining after the substrate etch can be removed, for example, using a nitride-selective etch, such as nitride-selective RIE.

As highlighted above, in one exemplary embodiment, the present techniques may be implemented to pattern fins in the wafer for use in fabricating a FINFET device. An exemplary implementation of the present techniques in the fabrication of a FINFET device is now described by way of reference to FIGS. 7A-7D.

In the example shown in FIG. 7, a plurality of fins has been patterned in the SOI layer. This can be accomplished, for example, using a RIE chemistry that is selective for the composition of the layer being patterned (in this case the SOI layer). As provided above, a SIT process can be used to pattern fins at a pitch beyond that achievable using standard lithography. Thus, according to an exemplary embodiment, the fins in this example have a pitch (or a distance between a point on one fin to the same point on an adjacent fin) of from about 10 nm to about 80 nm, e.g., from about 20 nm to about 40 nm.

The fins will be used as the base for fabricating the FINFET device. Basically, a FINFET device includes a source region and a drain region separated by one or more fin-shaped channels. A gate over the fins regulates electron flow in the channels.

Beginning with the patterned features shown in FIG. 7, the patterned transfer layer 502 (and any remaining portions of the oxide layer 104 remaining under the patterned transfer layer 502) is removed from on top of the fins. See FIG. 7A. As described above, this can be accomplished using a nitride-selective etch, such as a nitride-selective RIE. Another advantage of using a (nitride) transfer layer is that the patterned transfer layer 502 can be removed from the fins without causing any erosion of the underlying oxide. Namely, referring to FIG. 7A, once the fins have been patterned in the SOI layer, the underlying BOX is exposed. An etch may be performed to remove the hardmask from on top of the fins. With conventional processes, the fin hardmasks (formed from the sidewall spacers) typically are an oxide material. Removing the fin hardmasks in that case will also inevitably erode the BOX. BOX erosion undesirably will cause more topography and/or cause the fins to float away. Advantageously, with the present techniques, the sidewall spacers are removed while the BOX is unexposed (i.e., prior to patterning the SOI). See for example FIG. 5 and FIG. 6. Post fin-patterning, the (nitride) patterned transfer layer can easily be removed from atop the fins with a selective etch, leaving the BOX unaffected (i.e., intact and uneroded).

Figure 7B:
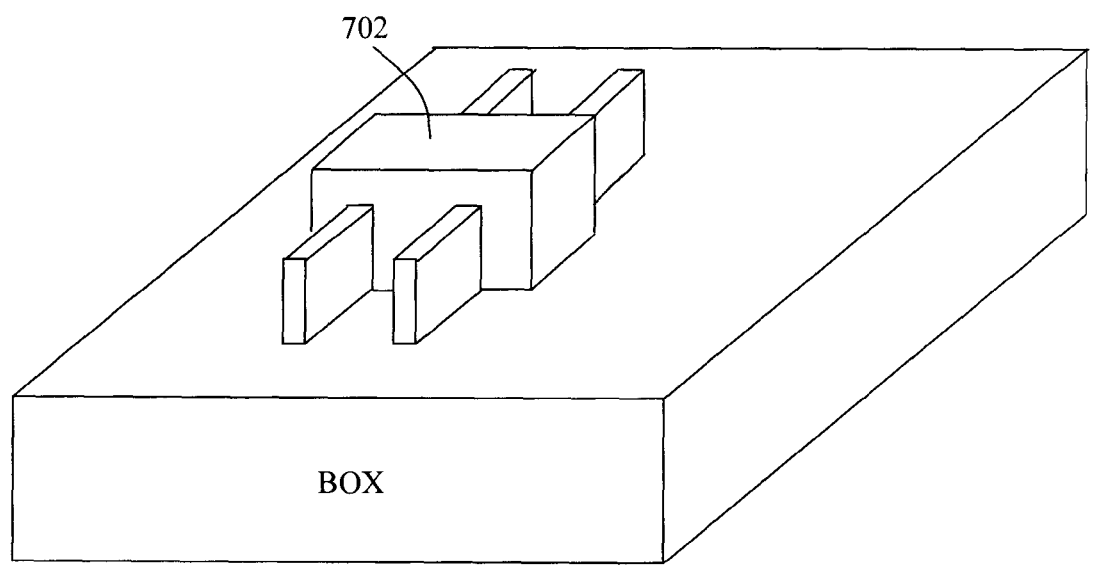
FIG. 7B is a three-dimensional diagram illustrating a gate electrode having been formed over a portion of each of the fins that will serve as a channel region of the FINFET device according to an embodiment of the present invention.

The perspective of the figures is now switched to a three-dimensional view (for example from vantage point A—see FIG. 7A) in order to best illustrate the steps of the device fabrication process that follow. As shown in FIG. 7B, a gate electrode 702 is formed over a portion of each of the fins that will serve as a channel region of the FINFET device. Portions of the fins that extend out from under the gate electrode 702 will serve as source and drain regions of the FINFET device. The gate electrode may be formed by depositing a gate material or materials onto the fins and then patterning the gate material(s) using a standard lithography and etching process. Suitable gate materials include, but are not limited to doped polysilicon, a metal and/or a combination of metals. A gate dielectric (not shown) may be deposited onto the fin channels prior to the gate electrode formation. Suitable gate dielectrics include, but are not limited to, oxide materials such as silicon oxide, and high-k dielectrics such as hafnium oxide and lanthanum oxide.

Figure 7C:
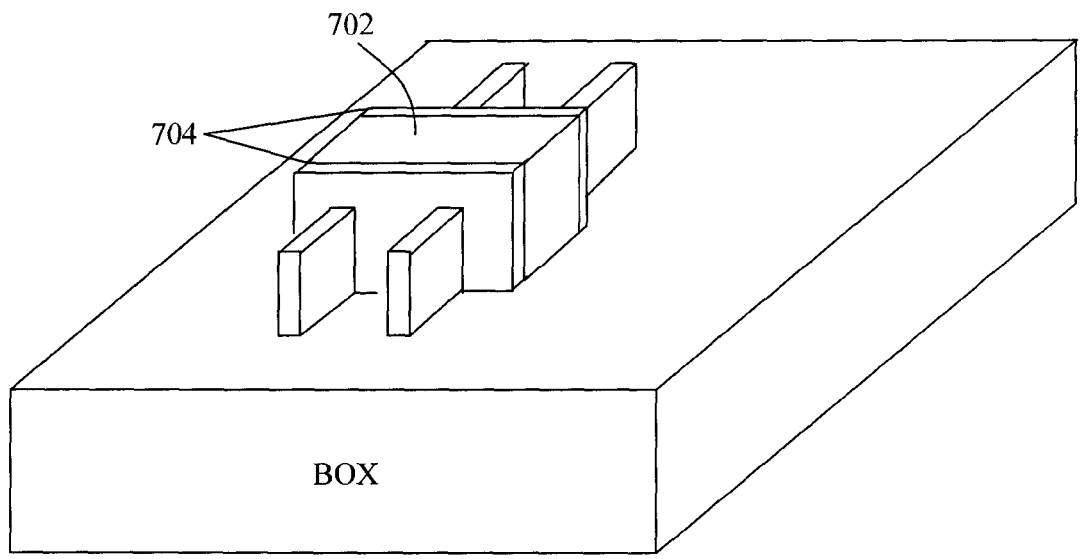
FIG. 7C is a three-dimensional diagram illustrating spacers having been formed on opposite sides of the gate electrode according to an embodiment of the present invention.

As shown in FIG. 7C, spacers 704 may be formed on opposite sides of the gate electrode 702. Spacers 704 serve to offset the channel region from source and drain regions of the FINFET device. Spacers 704 may be formed by depositing a spacer material onto the substrate and then patterning the spacer material using a standard lithography and etching process. Suitable spacer materials include, but are not limited to, a nitride material such as silicon nitride.

Figure 7D:
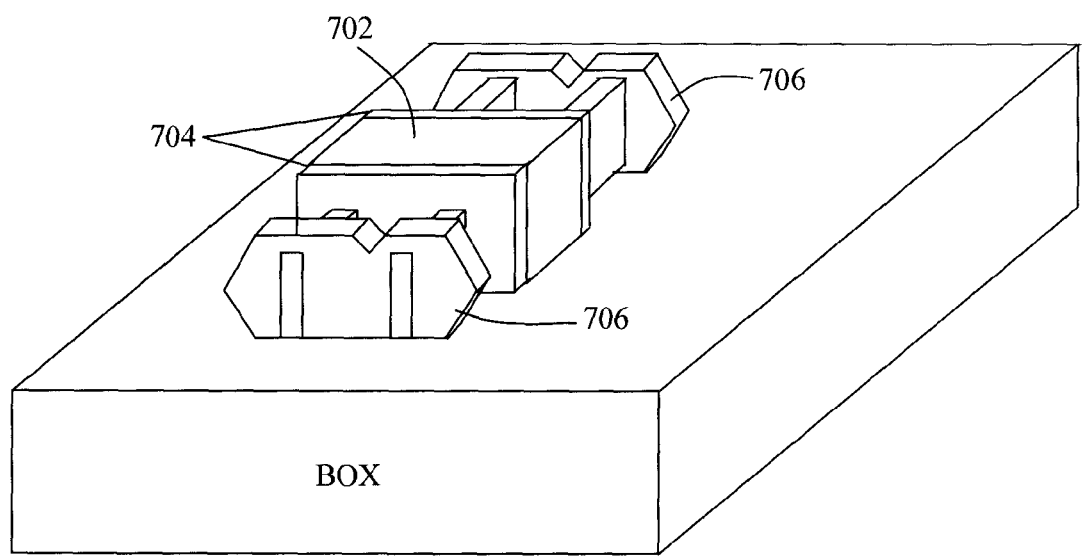
FIG. 7D is a three-dimensional diagram illustrating an epitaxial material having been grown over the fins in the source and drain regions of the FINFET device according to an embodiment of the present invention.

As shown in FIG. 7D, an epitaxial material 706 is grown over the fins in what will serve as the source and drain regions of the FINFET device. Source and drain implants can be introduced to the region, e.g., in-situ—during growth of the epitaxial material 706, or ex-situ—by way of an ion implantation. Either in-situ or ex-situ implants may then be activated using an activation anneal. Silicide contacts (not shown) may be formed to the source and drain regions. The specific parameters for source region/drain region and silicide formation techniques are well known to those of skill in the art and thus are not described further herein.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A sidewall image transfer (SIT) method, comprising:
    forming an oxide layer on a silicon-on-insulator (SOI) substrate having a SOI layer over a buried oxide (BOX);
    forming a nitride transfer layer on a side of the oxide layer opposite the SOI substrate;
    forming a mandrel layer on a side of the nitride transfer layer opposite the oxide layer;
    patterning the mandrel layer to form at least one mandrel, wherein the patterning of the mandrel layer to form the at least one mandrel results in the at least one mandrel extending part way into the nitride transfer layer;
    forming oxide sidewall spacers on opposite sides of the at least one mandrel;
    removing the at least one mandrel, wherein the nitride transfer layer covers and protects the SOI substrate during removal of the at least one mandrel;
    etching the nitride transfer layer using the oxide sidewall spacers as a hardmask to form a patterned nitride transfer layer;
    removing the oxide layer and the oxide sidewall spacers from the SOI substrate selective to the patterned nitride transfer layer using an oxide removal process, wherein the SOI layer covers and protects the BOX during the removing of the oxide layer and the oxide sidewall spacers;
    etching the SOI substrate using the patterned nitride transfer layer as a another hardmask to form features in the SOI substrate; and
    removing the patterned nitride transfer layer from on top of the features using a nitride-selective etch which prevents erosion of the BOX.

2. The method of claim 1, wherein the oxide layer has a thickness of from about 1 nm to about 5 nm.

3. The method of claim 1, wherein the oxide layer has a thickness of from about 1 nm to about 2 nm.

4. The method of claim 1, wherein the nitride transfer layer has a thickness of from about 30 nm to about 50 nm.

5. The method of claim 1, further comprising:
    planarizing the nitride transfer layer.

6. The method of claim 1, wherein the mandrel layer comprises amorphous silicon.

7. The method of claim 1, further comprising:
    depositing an oxide material for the oxide sidewall spacers onto the SOI substrate so as to bury the at least one mandrel; and
    patterning the oxide material using an etch to form the oxide sidewall spacers, wherein the etch has a selectivity for the oxide material as compared to the nitride transfer layer of less than or equal to about 1:2 such that the etch used to pattern the oxide material also patterns a portion of the nitride transfer layer.

8. The method of claim 1, wherein the at least one mandrel is removed using a wet etching process.

9. The method of claim 1, wherein the nitride transfer layer is etched using RLSA™ plasma etching.

10. The method of claim 1, wherein the oxide layer and the oxide sidewall spacers are removed from the SOI substrate using a COR process or a Siconi™ preclean.

11. The method of claim 1, wherein the features formed in the SOI substrate comprise fins having a pitch of from about 10 nm to about 80 nm.

12. The method of claim 11, wherein the fins have the pitch of from about 20 nm to about 40 nm.

13. A method of fabricating a FIN field-effect transistor (FINFET) device, comprising:
    forming an oxide layer on a semiconductor-on-insulator (SOI) substrate having a SOI layer over a buried oxide (BOX);
    forming a nitride transfer layer on a side of the oxide layer opposite the SOI substrate;
    forming a mandrel layer on a side of the nitride transfer layer opposite the oxide layer;
    patterning the mandrel layer to form at least one mandrel, wherein the patterning of the mandrel layer to form the at least one mandrel results in the at least one mandrel extending part way into the nitride transfer layer;
    forming oxide sidewall spacers on opposite sides of the at least one mandrel;
    removing the at least one mandrel, wherein the nitride transfer layer covers and protects the SOI substrate during removal of the at least one mandrel;
    etching the nitride transfer layer using the oxide sidewall spacers as a hardmask to form a patterned nitride transfer layer;
    removing the oxide layer and the oxide sidewall spacers from the SOI substrate selective to the patterned nitride transfer layer using an oxide removal process, wherein the SOI layer covers and protects the BOX during the removing of the oxide layer and the oxide sidewall spacers;
    etching the SOI layer using the patterned nitride transfer layer as another hardmask to form fins in the SOI layer;
    removing the patterned nitride transfer layer from on top of the fins using a nitride-selective etch which prevents erosion of the BOX; and
    forming a gate electrode over a portion of each of the fins that serve as a channel region of the FINFET device, and wherein portions of the fins that extend out from under the gate electrode serve as source and drain regions of the FINFET device.

14. The method of claim 13, further comprising:
    growing an epitaxial material over the fins in the source and drain regions of the FINFET device.

* * * * *